United States Patent [19]

Mehrotra et al.

[11] Patent Number: 5,428,621
[45] Date of Patent: Jun. 27, 1995

[54] LATENT DEFECT HANDLING IN EEPROM DEVICES

[75] Inventors: Sanjay Mehrotra, Milpitas; Winston Lee, South San Francisco; George Samachisa, San Jose; Stephen J. Gross, Santa Clara, all of Calif.

[73] Assignee: SunDisk Corporation, Santa Clara, Calif.

[21] Appl. No.: 948,175

[22] Filed: Sep. 21, 1992

[51] Int. Cl.$^6$ ............................................. G06F 11/00
[52] U.S. Cl. ................................... 371/21.4; 371/10.3
[58] Field of Search ............ 371/21.4, 21.6, 10.1–10.3; 365/184, 185, 200, 201; 324/158 T

[56] References Cited

U.S. PATENT DOCUMENTS

| | | | |
|---|---|---|---|
| 4,841,482 | 6/1989 | Kreifels et al. | 371/21.4 |
| 4,937,826 | 6/1990 | Gheewala et al. | 371/21.4 |
| 5,095,344 | 3/1992 | Harari | 371/21.4 |
| 5,151,906 | 9/1992 | Sawada | 371/21.4 |

FOREIGN PATENT DOCUMENTS

| | | |
|---|---|---|
| 032015A2 | 7/1981 | European Pat. Off. . |
| 101107A2 | 2/1984 | European Pat. Off. . |
| 306990A2 | 3/1989 | European Pat. Off. . |
| 451595A2 | 10/1991 | European Pat. Off. . |
| 480752A3 | 4/1992 | European Pat. Off. . |
| 568439A1 | 11/1993 | European Pat. Off. . |
| 90/01984 | 4/1990 | WIPO . |

OTHER PUBLICATIONS

*English Abstract of European Patent No. EPO 568 439 A1.

*Primary Examiner*—Vincent P. Canney
*Attorney, Agent, or Firm*—Majestic, Parsons, Siebert & Hsue

[57] ABSTRACT

A memory system having a two dimensional array of EEPROM or Flash EEPROM cells is addressable by rows and columns. A word line is connected to the control gates of all the cells in each row, an erase line is connected to all the erase gates of each sector of cells, and a pair of bit lines are connected respectively to all the sources and drains of each column of cells. The memory system incorporates a word line current detector and an erase line current detector in addition to the usual bit line current detectors. The leakage current of each of the lines are measured after predetermined memory events such as program or erase operations. When a defective row or column is detected, it is electrically isolated from other columns by programming and is mapped out and replaced. Data recovery schemes include reading a defective column by a switched-memory-source-drain technique.

64 Claims, 10 Drawing Sheets

EXAMPLE VOLTAGE CONDITIONS FOR NORMAL MEMORY OPERATIONS

| TYPE OF LINES | READ | PROGRAM | ERASE |
|---|---|---|---|
| Selected Word line (WL) | 5V | 12V | 0V |
| Non-selected Word line (WL) | 0V | 0V | 0V |
| Selected Source line (SL) | 0V | 0V | 0V |
| Selected Drain line (DL) | 1.5V | 8V | 0V |
| Non-selected bit lines (BL) | float | float | 0V |
| Selected Erase line (EL) | 0V | 0V | 20V |
| Non-selected Erase line (EL) | 0V | 0V | 0V |

Fig. 3

LEAKY WORD LINE (WL) TESTS (EXAMPLES)

| TEST | SELECTED WL LINE(S) | NON-SELECTED WL LINES | OTHER LINES | POSSIBLE SHORT CIRCUIT |
|---|---|---|---|---|
| W1. Global | All WL 5V, 12V | - | EL,BL=0V | WL- EL,BL, SUBSTRATE |
| W2. Single | 5V, 12V | 0V | EL,BL=0V | WL- EL,BL, SUBSTRATE |
| W3. Single, BL=float | 5V, 12V | 0V | EL=0V, BL=float | WL- EL, SUBSTRATE |
| W4. Single, EL=float | 5V, 12V | 0V | EL=float BL=0V | WL- BL, SUBSTRATE |

Fig. 8

LEAKY ERASE LINE (EL) TESTS (EXAMPLES)

| TEST | SELECTED EL LINE(S) | NON-SELECTED EL LINES | OTHER LINES | POSSIBLE SHORT CIRCUIT |
|---|---|---|---|---|
| E1. Global | All EL 20V | - | WL,BL=0V | EL- WL,BL, SUBSTRATE |
| E2. Single | 20V | 0V | WL,BL=0V | EL- WL,BL, SUBSTRATE |
| E3. Single, BL=float | 20V | 0V | WL=0V, BL=float | EL- WL, SUBSTRATE |
| E4. Single, WL=float | 20V | 0V | WL=float BL=0V | EL- BL, SUBSTRATE |

Fig. 9

LEAKY BIT LINE (BL) TESTS (EXAMPLES)

| TEST | SELECTED BL LINE(S) | NON-SELECTED BL LINES | OTHER LINES | POSSIBLE SHORT CIRCUIT |
|---|---|---|---|---|
| B1. Global | All BL 1.5V, 8V | - | WL,EL=0V | BL- WL,EL, SUBSTRATE |
| B2. Single | 1.5V, 8V | 0V | WL,EL=0V | BL- WL,EL, BL SUBSTRATE |
| B3. Single | 1.5V, 8V | float | WL,EL=0V | BL- WL,EL, SUBSTRATE |

Fig. 10

ALTERNATIVE LEAKY BIT LINE (BL) TESTS (EXAMPLES)

| TEST | SELECTED LINE(S) | NON-SELECTED LINES | POSSIBLE SHORT CIRCUIT |
|---|---|---|---|
| C1. 2-Pass Global alternate columns | Alternate col. SL=0V DL=1.5V, 8V | WL=0V EL=0V | DL-SL,WL,EL |
| C2. Single column | SL=0V DL=1.5V, 8V | BL=float WL=0V EL=0V | DL-SL,WL,EL |
| C3. Single (Read dedicated "1" sector) | SL=0V DL=1.5V WL=5V | BL=float WL=0V EL=0V | DL-SL,WL,EL |
| C4. Single (Read dedicated "0" sector) | SL=0V DL=1.5V WL=5V | BL=float WL=0V EL=0V | Bit line select transistor |

Fig. 11

COMBINATION TEST

| WL | EL | BL | POSSIBLE SHORT CIRCUIT |
|---|---|---|---|
| short | open | 0V | WL- BL, SUBSTRATE |
| short | open | float | WL- SUBSTRATE |
| short | short | float | WL- EL, SUBSTRATE |

Fig. 12

LATENT DEFECT HANDLING IN EEPROM DEVICES

BACKGROUND OF THE INVENTION

This invention relates generally to semiconductor memory, and more specifically to a device and method for detecting and handling latent defects in EEPROM or flash EEPROM devices which are not readily detectable during normal read, write and erase operations of the devices.

Computers and digital systems typically use magnetic disk drives for permanent mass storage of data. However, disk drives are disadvantageous in that they are bulky and in their requirement for high precision moving mechanical parts. Consequently, they are not rugged, and are complicated and prone to reliability problems, as well as consuming significant amounts of power. Alternative form of mass storage in place of disk drives are being contemplated.

Semiconductor or solid-state memory is typically formed as an integrated circuit (IC) device with a two-dimensional array of memory cells arranged in rows and columns. Each cell contains a transistor which can be put into one of its conduction states to designate one of the memory states.

Memory devices such as Random Access Memory (RAM), Read only Memory (ROM), Programmable read-only memory (PROM), UV Erasable PROM (UVEPROM), Electrically Erasable programmable read-only memory (EEPROM) and Flash EEPROM do not suffer from these disadvantages. However, in the case of RAM, the memory is volatile, and requires constant power to maintain its memory. Consequently, RAMs are typically used as temporary working storage.

ROM, EEPROM and Flash EEPROM are all non-volatile solid state memories. They retain their memory even after power is shut down. However, ROM and PROM cannot be reprogrammed and UVPROM cannot be erased electrically.

On the other hand, EEPROM and Flash EEPROM have the further advantage of being electrically writable (or programmable) and erasable. Nevertheless, they have a limited lifetime due to the endurance-related stress the device suffers each time it goes through an erase/program cycle.

The endurance of a Flash EEPROM device is its ability to withstand a given number of program/erase cycles. The physical phenomenon limiting the endurance of conventional EEPROM and Flash EEPROM devices is trapping of electrons in the active dielectric films of the device. During programming, electrons are injected from the substrate to the floating gate through a dielectric interface. Similarly, during erasing, electrons are extracted from the floating gate to the erase gate through a dielectric interface. In both cases, some of the electrons are trapped by the dielectric interface. The trapped electrons oppose the applied electric field in subsequent program/erase cycles thereby causing the programmed threshold voltage to shift to a lower value and the erased threshold voltage to shift to a higher value. This can be seen in a gradual closure in the threshold voltage "window" between the "0" and "1" states. The window closure can become sufficiently severe to cause the reading circuitry to malfunction. If cycling is continued, the device eventually experiences catastrophic failure due to a ruptured dielectric which is known as the intrinsic breakdown of the device. Thus, with use, defects tend to build up in the memory array and typically the devices are rendered unreliable after a large number (e.g. $10^4$) write/erase cycles. The defects may be due to defective cells such as shorts between the various cell structures or due to defective infrastructure in the memory device such as shorts in the interconnects or device isolation.

Traditionally, EEPROM and Flash EEPROM are used in applications where semi-permanent storage of data or program is required but with a limited need for reprogramming. Defects in these devices are treated in the same manner as RAM's.

Physical defects in these devices arising from the manufacturing process are corrected at the factory similar to conventional memory devices such as RAM and magnetic disks. It is the usual practice in semiconductor memories to have redundant memory cells built into the chip. Those defective cells discovered after fabrication are discarded and remapped to these redundant cells in the array. The remapping is usually done by hard wiring at the factory. The device is then assumed to be perfect and there is little or no provision for replacing defective cells resulting from defects that appear later during normal operation. Error corrections mainly rely on schemes using error correction codes (ECC) which typically correct a limited number of random errors.

As explained above, owing to the nature of EEPROM and Flash EEPROM devices, cell failures tend to accumulate with increasing write/erase cycling. If the device is used in applications going through many write/erase cycles, the errors from the defective cells that accumulate will eventually overwhelm the ECC and render the device unreliable.

Implementations of EEPROM and Flash EEPROM as disk-like mass storage systems have been disclosed in two U.S. patent applications which have the same assignee as the present application. They are U.S. patent application, Ser. No. 337,566 of Harari et al., filed Apr. 13, 1989, now abandoned, and U.S. patent application, Ser. No. 422,949 of Gross et al., filed Oct. 17, 1989, U.S. Pat. No. 5,200,959.

In these disk-like applications, where the devices are subjected to writing and erasing a large number of times, traditional methods of handling defects in solid-state memories are inadequate because there is no effective provision for detecting and handling defects "on-the-fly" except by means of ECC.

Defect handling after the devices have left factory becomes necessary. Co-pending U.S. patent application, Ser. No. 337,566 of Harari et al. discloses a scheme of detecting and handling defects "on-the-fly" by verifying each memory operation, such as read, write or erase, after its has been performed. A verification failure indicates a defective cell, and the defective cell is remapped with a good one. Similarly co-pending U.S. patent application, Ser. No. 422,949 of Gross et al. discloses a scheme of detecting and handling defects "on-the-fly."

These defect detection schemes are based on detecting defects cell-by-cell, by sensing abnormal read, write or erase operating conditions of the memory devices. However, they are not very sensitive to weak defects which may later develop into catastrophic defects. For example, a small voltage drop caused by a weak defect may escape detection because it is still within the margin of error allowed by the read, write or erase operations.

The cell-by-cell defect detection and remapping scheme may not be the most efficient for an array of EEPROM cells. The usual memory array is accessible by a series of word lines, each connecting to all the control gates of cells row-by-row, and a series of bit lines, each connecting to all the sources or to all the drains of cells column-by-column. Failure at one cell location could affect a whole row or column of cells by virtue of connection to a common word line, erase line or bit line. Indeed, in a virtual ground architecture where the cells in a row are daisy-chained by their sources and drains, failure in one column may even propagate to neighboring columns of cells. Thus, when a cell fails to verify correctly, the failure could be caused by a defect at that cell location or by a defect from a neighboring cell location. In either case, the exact location and extent of the defect is uncertain. Without this knowledge, effective and efficient error correction can not be readily implemented.

Accordingly, it is an object of the present invention to detect weak or latent defects before they manifest as catastrophic failures during read, write or erase failures, and to determine the nature, location and extent of these defects so as to handle them efficiently.

It is another object of the invention to provide a simple and low cost EEPROM or Flash EEPROM memory system which can be reliably written and erased many times.

It is another object of the invention to provide a solid-state memory system capable of handling efficiently defects detected during use of the device.

It is another object of the invention to provide a method for efficiently handling defects detected during factory testing and field use of solid-state memory systems.

SUMMARY OF THE INVENTION

These and additional objects are accomplished by improvements in solid-state memory systems such as EEPROM and Flash EEPROM systems and in techniques that allow efficient and effective handling of defects.

A memory cell becomes defective when one or more of its electrodes such as its control gate, erase electrode, source, drain or substrate becomes short circuited. The short circuit may occur between electrodes of the same cell or between that of different cells. Depending on which is shorted to which, in a memory array, this could result in a shorted word line, erase line or one or more bit lines.

The invention allows leakage currents in word lines, erase lines and bit lines to be monitored in various test modes of the memory system. These test modes may be advantageously applied to deal with defects arising from the manufacturing process at the factory, as well as with defects resulting from stresses through normal use in the field.

A defective line is identified by detection of abnormal leakage current in it. The leakage current is detected by current detectors or sense amplifiers that can be connected to the word lines, erase lines and bit lines under test. This is accomplished by incorporating into the memory system a word line current detector and an erase line current detector in addition to the existing bit line current detectors. Whenever a line is under test, a potential difference is established between it and neighboring lines it is capable of being shorted to. If a short circuit exists, abnormal leakage current will be detected in the shorted line.

In an alternative embodiment of the invention, a bit line leakage is detected by abnormally high leakage current in each pair of bit lines in a column or a set of columns under test when they are powered up to voltage condition for a read operation while all the word lines and erase lines are grounded.

In another embodiment of the invention, each column in the array has at least one dedicated memory cell pre-programmed to a memory state (e.g., "1" in a two-state embodiment) that corresponds to a low conduction state when the dedicated memory cell is read, and bit-line-to-bit-line leakage is detected by abnormal leakage current therein when the dedicated memory cell are read.

In another embodiment of the invention, each column in the array has at least one dedicated memory cell pre-programmed to an "erased" memory state (e.g., "0") that corresponds to a high conduction state when the dedicated memory cell is read. The dedicated memory cell is used to test a defective bit line which has stuck HIGH due to a short circuit in its column-select transistor. This would cause some of the current in the bit line to be diverted to the short circuit path. In that event, a read of the dedicated memory cell in the defective column will give a reduced current therein under normal read condition.

In yet embodiment of the invention, the read operation under test mode condition is made with a predetermined reference current which may be significantly less than that used for normal read condition.

According to another aspect of the invention, a set of lines for each type are tested simultaneously, set-by-set to speed up the testing. When a leakage current is detected among a set of lines, the lines therein can be further tested line-by-line to identify the defective line. In another embodiment, a current detector is provided for each line in the set so that testing may be performed in parallel. In a global testing scheme, the set consists of all word lines or all erase lines or all bit lines of the memory device.

According to another aspect of the invention, several tests are combined to distinguish what type of lines a leaky line under test is shorted. For example, if a leakage current is detected in a word line under test, and the related bit lines are electrically floated, the word line can not be shorted to the bit lines. By floating different type of lines and testing in turn, it is possible to determine, by a process of elimination, which type of line the word line under test is shorted to.

When a defective line is detected, it is handled according to what type of line it is. A word line defect results in a row defect; a bit line defect results in a column defect; and an erase line defect results in a sector (one or more rows that are erasable together) defect. Generally, the defective row, column or sector may be mapped out and replaced after data therein are recovered.

According to a general aspect of the invention, the leakage current of each of the lines are measured and any detected defects handled after predetermined memory events such as after one or more program or erase operations.

According to another aspect of the invention, when a defective word line is detected, the entire row of cells for that word line is mapped out. If it is detected after a program operation, the data is recoverable from a data buffer in the memory system and is rewritten to a new row of cells.

According to another aspect of the invention, when a defective erase line is detected, the entire sector of cells for that erase line is mapped out.

Defect handling for bit line depends on the type of bit line defect detected. Two type of defects may be distinguished. The first, "leaky column" relates to defects due to a bit line being shorted to a word line, an erase line or the substrate. The second, "bit-line-to-bit-line short" relates to defects due to a short circuit between a pair of adjacent bit lines.

In the "leaky column" case, the whole column where the defective bit line is a drain line is mapped out after the data therein have been recovered.

In the second case, several ways of handling the defect are possible. In one implementation, only the defective cell along the bit line causing the defect is mapped out after its data has been recovered. In another implementation, all the cells in the segment of the bit line lying in the sector containing the defective cell are mapped out after their data have been recovered. In yet another implementation, all the cells along the defective bit line or column are mapped out after having their data recovered.

According to another aspect of the invention, data from a defective column are preferably recovered by a switch-memory-source-drain (SMSD) scheme. The SMSD scheme is based on the fact that a memory cell can also be read with the polarity of the voltage across the source and drain reversed. During normal read operation, the source is at ground potential while the drain is at a higher potential. Under SMSD, the drain is at ground potential while the source is at a higher potential. In this way, despite a drain line shorted to ground, data can still be recovered from the column of cells.

In general whenever possible, the data in a defective cell may be recovered by an error correcting code (ECC).

The defective cell, segment or column of cells that are mapped out are preferably electrically turned off to prevent the defects from propagating to neighboring columns. This is accomplished by programming the mapped out cells to a memory state (most "programmed") corresponding to one with the least drain-source current, $I_{DS}$. This will prevent conduction and therefore propagation of a short circuit to neighboring columns. In the case where the mapped out cells are so defective that they can not be electrically turned off, one or more adjacent columns may be turned off to isolate the defects.

In the case of a memory array with a virtual ground architecture where each column has a source bit line to the left of a drain bit line, and the drain bit line of one column is also the source bit line of the column to its right, failure in one bit line can propagate to bit lines to the left by virtue of source-drain conduction. In an alternative virtual ground architecture where each column has a drain bit line to the left of a source bit line, and the source bit line of one column is also the drain bit line of the column to its right, failure in one bit line can propagate to bit lines to the right by virtue of source-drain conduction. After the data in the column containing the failed bit line is recovered, the column is mapped out. To prevent the effect of the defective column from propagating to adjacent columns, one or more adjacent columns may be electrically isolated by programming the entire column of memory cells therein to a "1" memory state that corresponds to a low conduction state.

Additional objects, features and advantages of the present invention will be understood from the following description of the preferred embodiments, which description should be taken in conjunction with the accompanying drawings.

BRIEF DESCRIPTION OF THE DRAWINGS

FIG. 3 is a table listing typical examples of operation voltages for normal memory operations;

FIG. 8 is a table listing typical examples of operation voltage for testing word lines;

FIG. 9 is a table listing typical examples of operation voltage for testing erase lines;

FIG. 10 is arable listing typical examples of operation voltage for testing bit lines;

FIG. 11 is a table listing typical examples of operation voltages for alternative testing of bit lines.

FIG. 12 is a logic table illustrating diagnosis of defect type from combination of test results;

DETAILED DESCRIPTION OF THE PREFERRED EMBODIMENT

Figure 1A:
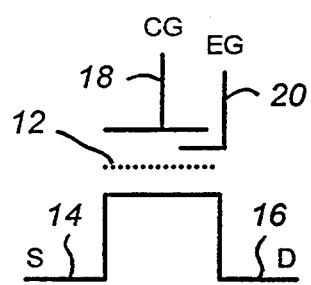
FIG. 1a is a schematic representation of a single EEPROM cell.
Figure 1B:
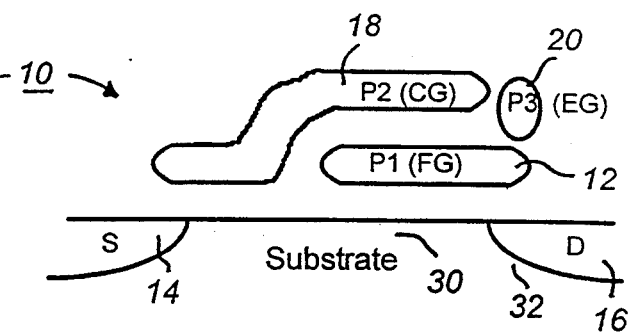
FIG. 1b is a cross-sectional view of an EEPROM device integrated circuit structure.

FIG. 1a illustrates schematically an EEPROM cell 10 having a floating gate 12, a source 14, a drain 16, a control gate 18 and an erase gate 20. An example of EEPROM cell structure is generally illustrated in the integrated circuit cross-sectional view of FIG. 1b. Describing this structure briefly, the memory cell 10 is formed on a lightly p-doped substrate 30. The source 14 and drain 16 are formed as two heavily n-doped implanted regions. The floating gate 12, control gate 18, and erase gate 20 are generally made of polysilicon material and insulated from each other and any other conductive elements of the structure by dielectric material.

The memory cell is programmed by transferring electrons from a channel in the substrate 30 to a floating gate, such as the floating gate 12 of the memory cell 10. In the example cell of FIG. 1b, the charge on the floating gate cell is increased by electrons travelling across the dielectric from the cell channel in the substrate near the drain 16 and onto the floating gate 12. Charge is removed from the floating gate through the dielectric between it and the erase gate 20. A preferred EEPROM structure, and the process for manufacturing it, are described in detail in copending U.S. patent application Ser. No. 323,779 of Jack H. Yuan and Eliyahou Harari, filed Mar. 15, 1989, now U.S. Pat. No. 5,070,032, which is expressly incorporated herein by reference.

The threshold voltage of the memory cell 10 is alterable and may be used to designate a number of memory states. It increases with the amount of negative charge on the floating gate 12. For the purpose of illustration, a 2-state memory cell will be used, although it will be understood that multi-state memory is also contemplated. When the floating gate has positive charge, the cell is regarded to be in an "erased" state or "0" state. On the other hand, if substantial negative charge is transferred into the floating gate, the memory cell is regarded to be in a "programmed" state. This corresponds to a "1" state in a 2-state memory cell. As an example, a memory cell may have an erase state corresponding to a threshold voltage of 1 V and a programmed state corresponding to a threshold voltage of 6 V. If a potential difference is applied to the source and drain, while 5 V is supplied to the control gate 18, the drain-source current $I_{DS}$ will be substantial if the cell is in the erased state, and $I_{DS}$ will be substantially zero if the cell is in the programmed state.

The various aspects of the present invention are typically applied to an array of flash EEPROM cells in an integrated circuit chip.

Figure 2:
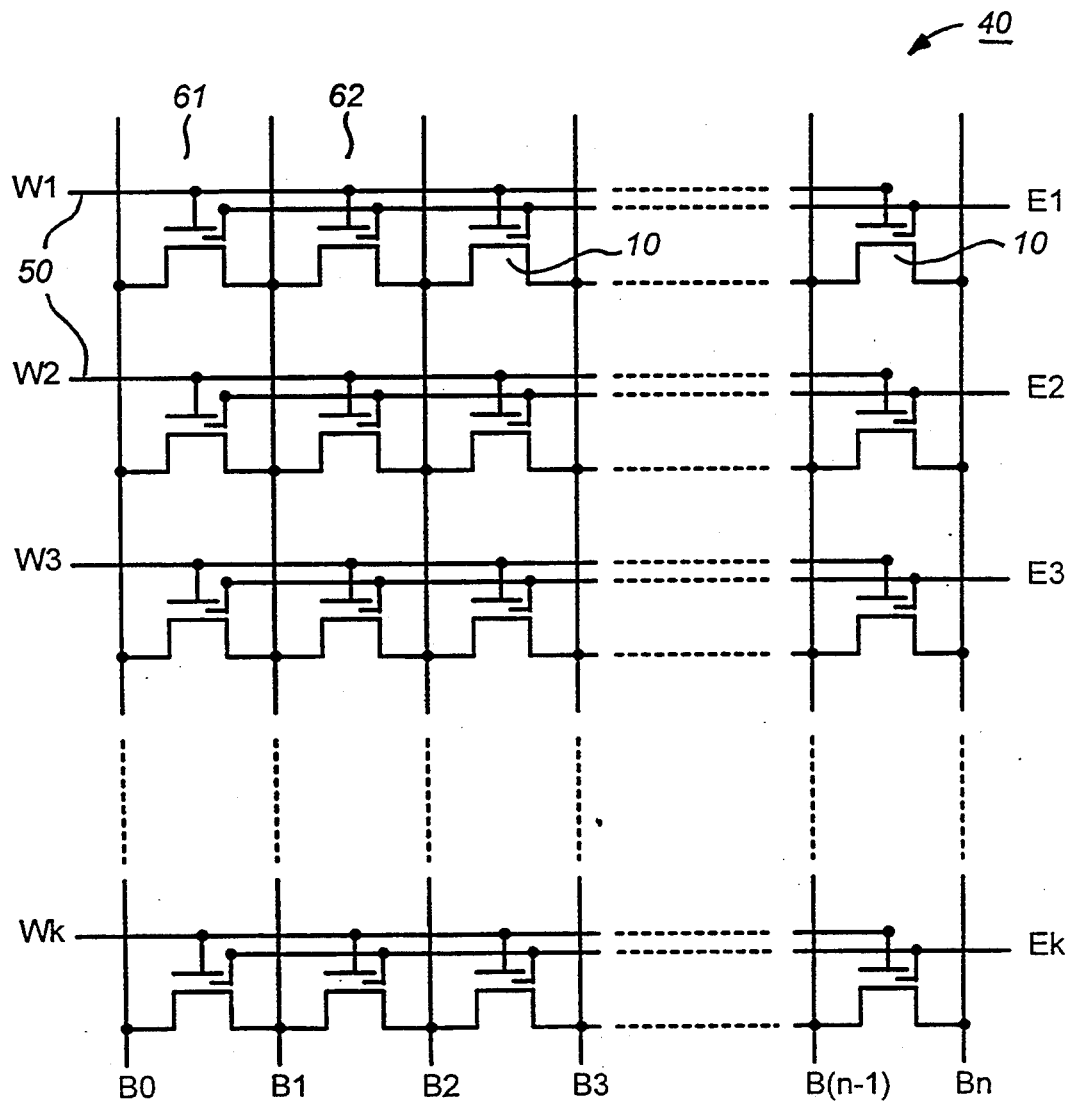
FIG. 2 shows a two-dimensional array of EEPROM cells addressable by word lines, bit lines and erase lines.

FIG. 2 illustrates schematically a two dimensional array of EEPROM cells 40. Each individually addressable cell 10 is equivalent to the one shown in FIG. 1a or 1b, having a control gate, a source, a drain and an erase gate. The array of individual memory cells are organized in rows and columns. Each cell is addressed by selectively energizing its row and column simultaneously. Along each row, a word line 50, such as $W_1$, $W_2$, is connected to all the control gates of the cells in the row. Along each column, all the cells have their sources and drains respectively connected to a pair of bit lines such as $B_0$, $B_1$ for column 61 and $B_1$, $B_2$ for column 62.

The embodiment illustrated in FIG. 2 has a virtual ground architecture in which the cells along a row are connected in series by their sources and drains. The drain of one cell is also the source of the adjacent cell to the right. Thus, the column 61 has the bit line $B_0$ as the source line (SL) and the bit line $B_1$ as the drain line (DL). Similarly, for the column 62, the bit line $B_1$ is the source line and the bit line $B_2$ is the drain line.

Access to the erase gate of each cell is similar to that of the control gate. An erase line such as $E_1$, $E_2$ is connected to the erase gate of each cell in a row. In preferred flash EEPROM devices, several rows of cells are erased together. In that case, these rows have their erase lines tied together and define a memory sector of cells.

FIG. 3 provides example voltage conditions of a Flash EEPROM for operations such as read, program and erase. Each cell is addressed by selecting the row and column in which it is located and applying appropriate voltage conditions for a given memory operation.

Figure 4:
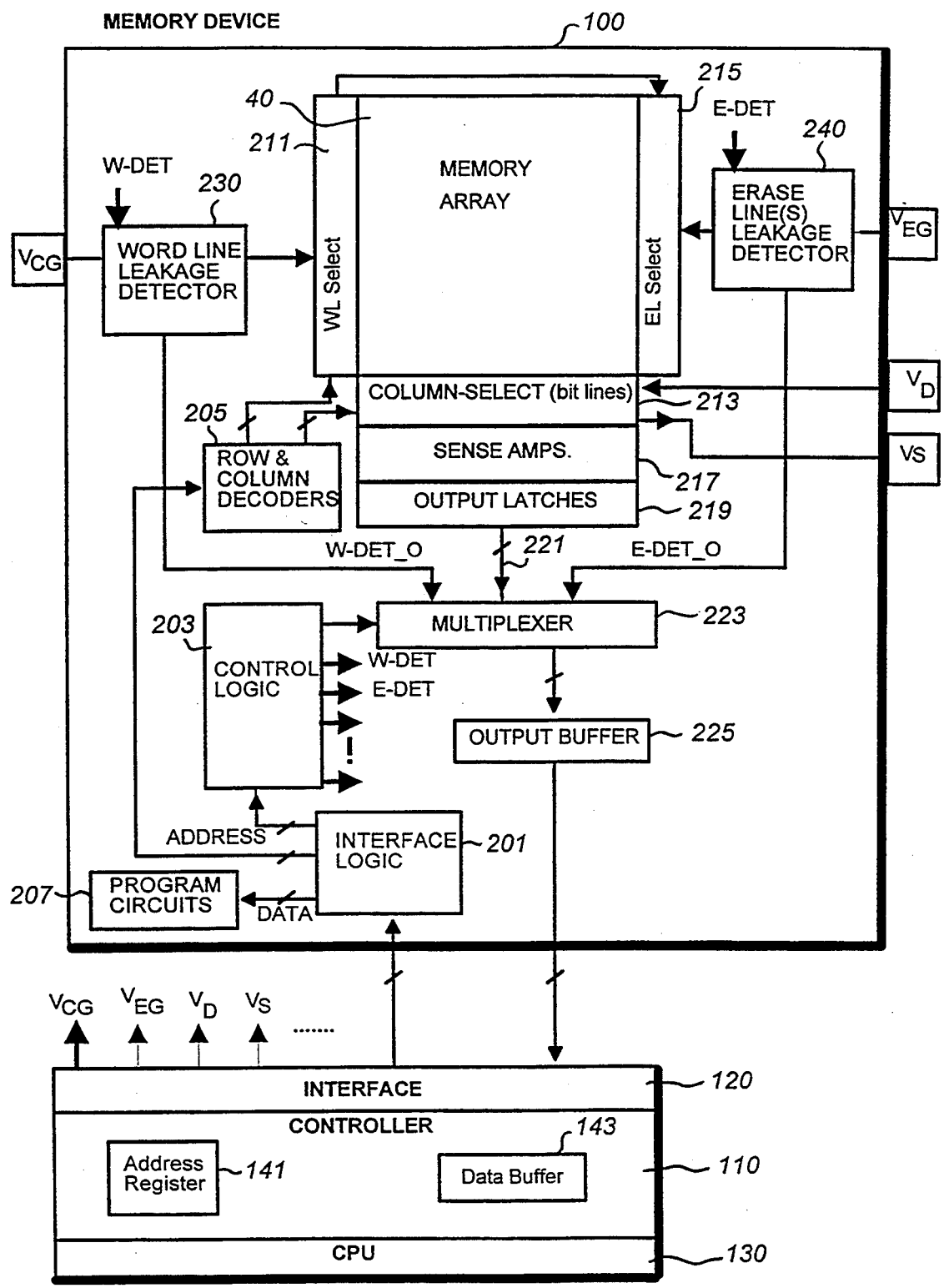
FIG. 4 is a block diagram of an EEPROM system in which the various aspects of the present invention are implemented.

FIG. 4 is a block diagram of an EEPROM system in which the various aspects of the present invention are implemented. Except for the additional word line leakage detector 230 and the erase line(s) leakage detector 240, the rest of the EEPROM system has essentially been described in co-pending U.S. patent application, Ser. No. 337,579 of Mehrotra et al., filed Apr. 13, 1989, now abandoned, which is expressly incorporated herein by reference.

Describing the EEPROM system briefly, it includes a memory device integrated circuit chip 100 under the control of a memory controller 110 via a controller interface 120. The memory controller 110 is also in communication with a host computer system 130. It includes an address register 141 and a data buffer 143. The memory controller controls the operations of the memory device chip 100 by supplying the appropriate voltages, controls and timing. The memory device chip 100 essentially comprises an addressable flash EEPROM array 40 such as that shown in FIG. 2, program and sensing circuits.

During operation of the memory device 100, an interface logic 201 routes the control and timing signals, addresses and data received from the memory controller 110 respectively to the control logic 203, row and column decoders 205 and program circuits 207. The decodes from the row and column decoders 205 selectively connect an addressed row and column to appropriate voltage sources VCG, $V_S$ and $V_D$.

For example, during a read or program operation, the appropriate control gate voltage $V_{CG}$ is passed onto the addressed word line via a word line select circuit 211. At the same time, appropriate source voltage $V_S$ and drain voltage $V_D$ are passed on to the addressed column via a column select circuit 213. Similarly, for erase operations, an appropriate erase voltage $V_{EG}$, is passed on to one or more selected erase lines via an erase select circuit 215.

During read operations, the memory state of an address cell is read by sensing the conduction current $I_{DS}$ through its source and drain. This is accomplished by sensing the drain current with a sense amplifier 217 relative to a reference current. In a preferred implementation, a chunk of memory cells (e.g., 64 cells) in a row are addressed in parallel. Thus, a plurality of sense amplifiers such as sense amplifiers 217, one for each selected column are employed for reading a chunk of memory cells. The outputs of the sense amplifiers 217, are latched by output latches 219 and passed by lines 221 via a multiplexor 223 and an output buffer 225 to the memory controller 110.

Figure 5:
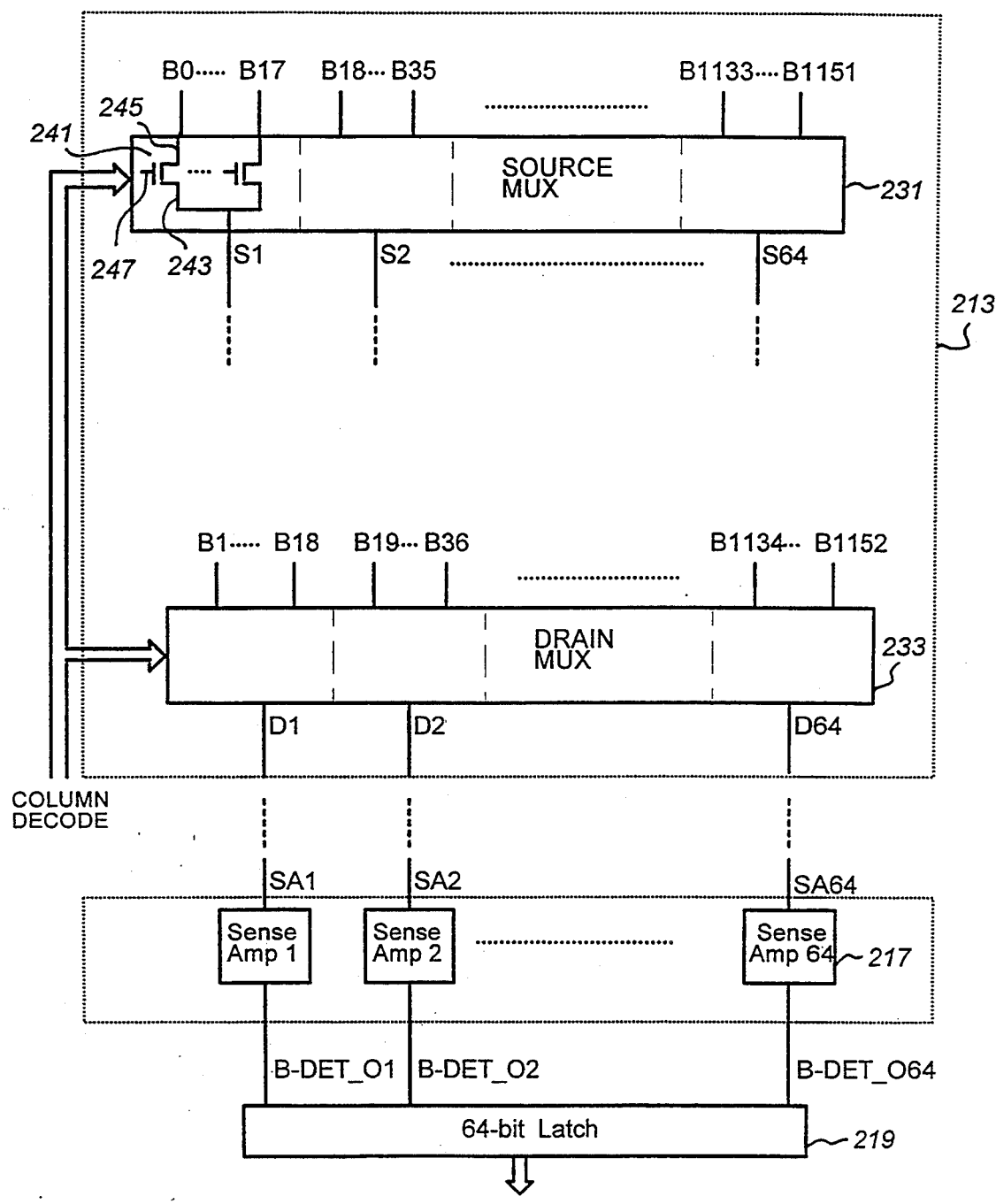
FIG. 5 illustrates in more detail the column-select, the sense amplified and output latch blocks shown in FIG. 3.

FIG. 5 illustrates in more detail one implementation of the column select, the sense amplifier and output latch blocks shown in FIG. 3. In principle, the column select 213 selectively connects the pair of bit lines in an addressed column to the source voltage $V_S$ and to the drain voltage $V_D$. In the preferred embodiment, a plurality of columns are selected in parallel. This is accomplished by a source multiplexor 231 and a drain multiplexor 233 which are controlled by column decode signals put out by the row and column decoders 205. As an example, the memory array 40 (see FIG. 4) consists of 1153 bit lines, $B_0$-$B_{1152}$. Each time 64 columns are selected in parallel. The source lines of the selected columns are connected to $V_S$ via $S_1$-$S_{64}$. The drain lines of the selected columns are connected to $V_D$ via $D_1$-$D_{64}$. The currents flowing in each of the drain line connect $D_1$-$D_{64}$ are sensed by a sense amplifier. In one implementation of the source and drain multiplexors 231,233, a bit line transistor such as 241 having a source 243, drain 245 and control gate 247 is typically used to gain access to a bit line such as $B_0$. The bit line is connected in series through the source and drain of its bit line select transistor. Conduction takes place between the source 243 and drain 245 when 5 V is supplied to the control gate 247 of the bit line select transistor 241. In this way, the bit line B0 becomes accessible to a sense amplifier such as SA1 via the select transistor 241.

In one embodiment of the present invention, the bit line under test may have its $I_{DS}$ sensed by the sense amplifier 217 with reference to a predetermined reference current. This predetermined reference current may be significantly less than the reference current used for normal read. If $I_{DS}$ exceeds the predetermined reference current, the bit line under test may be interpreted as having excessive leakage current.

Referring to FIG. 4 again, an important feature of the present invention is the incorporation of additional current sensors for word lines as well as erase lines. In the preferred embodiment, a word line leakage detector 230 is connected in series between a selected word line and its control gate voltage source $V_{CG}$. Similarly, an erase line leakage detector 240 is connected in series between one or more selected erase lines and their erase gate voltage source $V_{EG}$.

Figure 6:
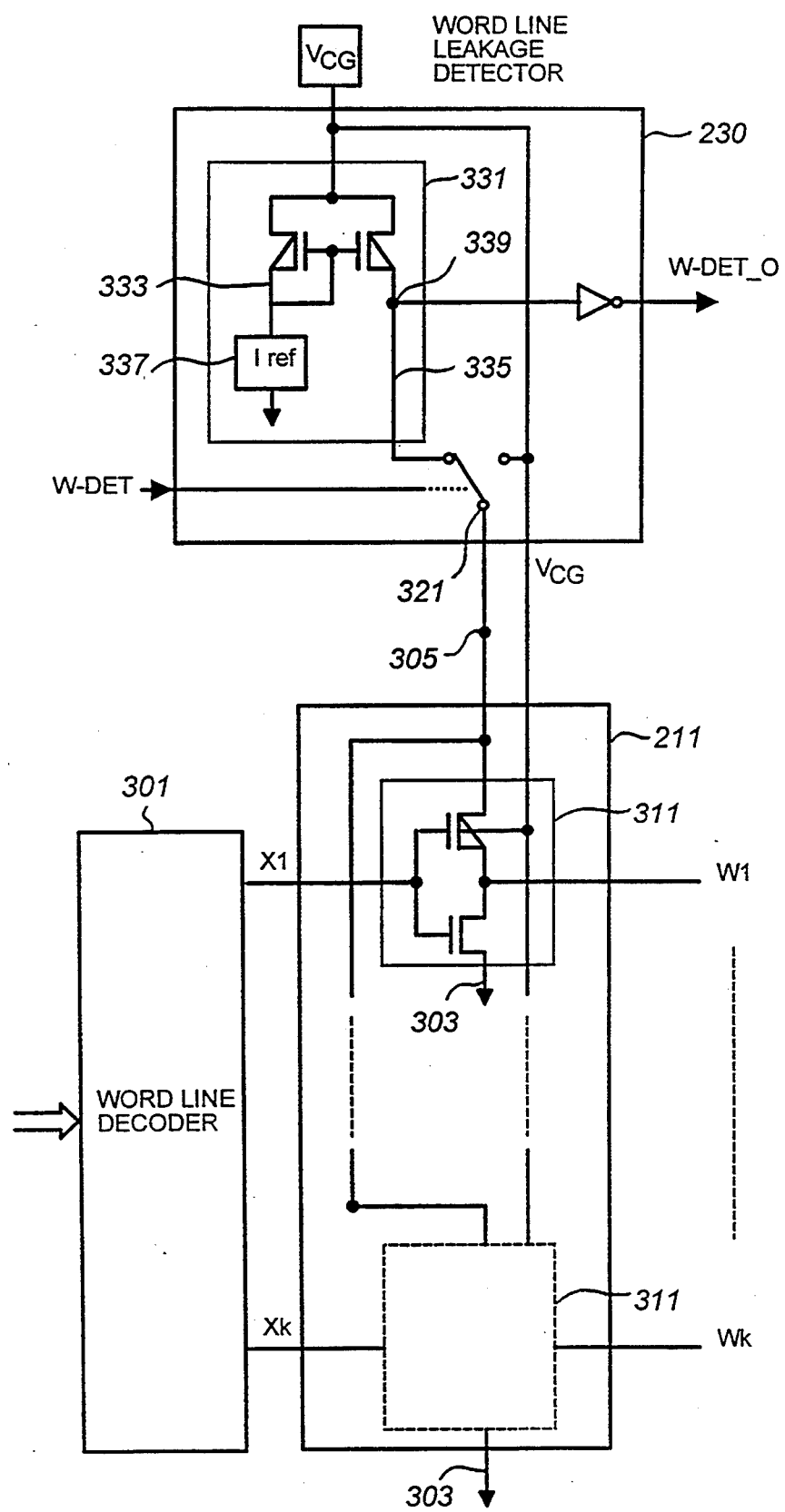
FIG. 6 illustrates in more detail the wordline leakage detector and the word-line select blocks shown in FIG. 3.

FIG. 6 illustrates in more detail the word line leakage detector 230 and the word line select circuit 211 shown in FIG. 3. A word line decoder 301, which is part of the row and column decoders 205 shown in FIG. 3 and the word line select circuit 211, serves to switch each word line $W_1$-$W_K$ either to a ground node 303 or to a node 305 connected to the word line leakage detector 230. The word line select circuit 211 comprises a plurality of select switches 311, one for each of the word lines $W_1$-$W_K$. Each of the select switches 311 is responsive to a word line decode signal, such as $X_1$-$X_K$. The word line $W_1$ is selected when its decode signal $X_1$ is asserted on the corresponding select switch 311. The switch 311 then pulls the word line $W_1$ to the node 305 which connects to the word line leakage detector 230. On the other hand, if $X_1$ is not asserted, the word line $W_1$ is not selected and the select switch 311 then pulls $W_1$ to ground via a line 303. The word line leakage detector 230 is placed in series between the node 305 and the control gate voltage source $V_{CG}$. During normal read or write operations, when the word line leakage current is not being measured, a switch 321 responsive to a non-asserting control signal W-DET switches the node 305 directly onto the control gate voltage source $V_{CG}$. On the other hand, when the control signal W-DET is asserted during the word line test mode, switch 321 connects the node 305 to a current sensing amplifier 331. In the preferred embodiment, the current sensing amplifier is implemented by a current mirror circuit having a first leg 333 and a second leg 335. A reference current source 337 is connected to the first leg 333. The second leg 335 is essentially connected to a selected word line via the node 305 and the switch 321 for sensing the current in the selected word line. The current mirror configuration is such that any differential in current through the two legs 333 and 335 results in the voltage in the second leg 335 being pulled up towards $V_{CG}$ or down towards ground 303. Thus, a node 339 at the second leg 335 is respectively HIGH (or LOW) when the current through the addressed word line is less (or more) than $I_{ref}$ through the second leg 333. In this way, the sensed result output as W-DET_O is LOW when the current through the addressed word line is less than $I_{ref}$, and is HIGH when it is greater than $I_{ref}$.

Figure 7:
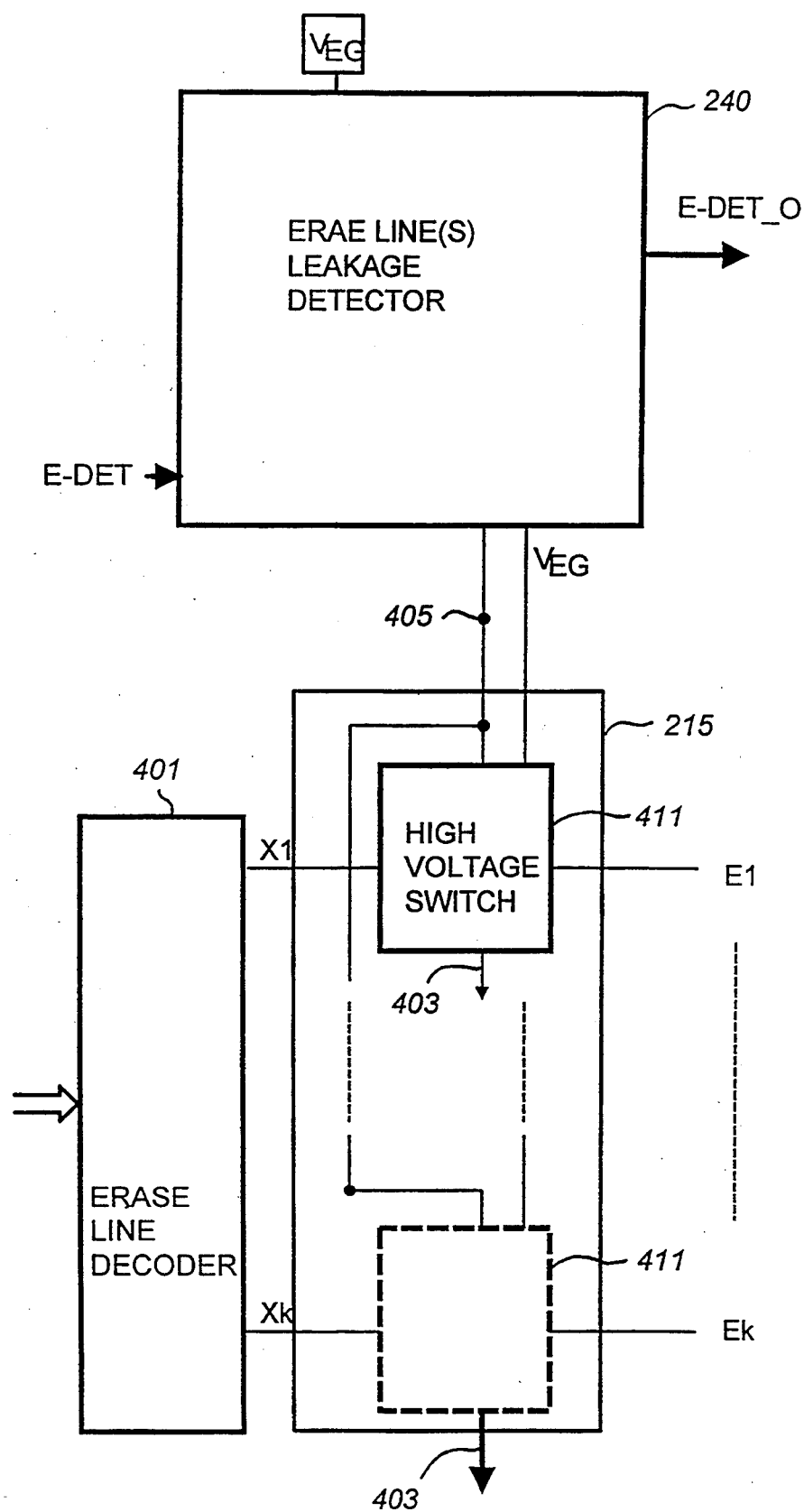
FIG. 7 illustrates in more detail the erase lines leakage detector and the erase line select blocks shown in FIG. 3.

FIG. 7 illustrates in more detail the erase lines leakage detector and the erase lines select blocks shown in FIG. 3. Similar to the word line select case, the erase line decoder 401, which is part of the row and column decoders 205 in FIG. 3 and the erase line select circuit 215, serves to select or unselect the erase lines $E_1$-$E_K$ by pulling either to a node 405 which connects the erase lines to the leakage detector 230 or to ground 403. The erase lines leakage detector is also similar to the word line leakage detector 230. Since the erase voltage is generally higher, the requirement for the select switch 411 and the erase lines leakage detector 240 is that they can operate at a higher voltage.

Defect Detection and Handling

An EEPROM cell is usually read by sensing the current $I_{DS}$ in the bit lines connected to its source and drain. In addition to the ability to sense bit line current, the present invention allows word line and erase line currents to be sensed also. This enables an hierarchy of row and column tests to be performed. The tests can be performed line-by-line or a set of one type of lines at a time. These tests are preferably implemented by the controller 110 (FIG. 4) under programmed control.

FIGS. 8, 9 and 10 are tables listing typical example test voltages for testing respectively word lines, erase lines and bit lines. A general scheme is to select one of the lines, such as a word line or an erase line or a bit line for testing. A potential difference is established between the line under test and at least neighboring lines capable of shorting to it. If the leakage current detected in the line under test is abnormal as it exceeds a predetermined level, a short circuit must have existed between the line under test and one or more of its neighboring lines.

The potential difference established is preferably comparable to the actual potential encountered in real situations. For example, in FIG. 8, a selected word line under test is raised to a potential difference of 5 V which corresponds to the condition under read operation, or raised to a potential difference of 12 V which corresponds to the condition under program operation.

In a preferred embodiment, instead of testing one line at a time, a set of lines are tested simultaneously to speed up the process. In a global scheme, all lines of one type are tested in parallel. For example as shown in FIG. 8, W1, all word lines in the array are raised to 12 volts relative to the other type of lines, and they can all be sensed by the same word line leakage detector. When the leakage detector registers an abnormally high leakage current, one of the word lines must be short circuited. In that case, the word lines in the array must be tested line-by-line (as in FIG. 8, W2 or W3 or W4) in order to isolate the defective word line.

In FIG. 8, tests W3 and W4 refer to the cases where the potential of one type of line is floated. If the test fails, the floated type of line can not be shorted to the line under test. By combinating various permutation of tests, it is possible to determine which type of line the line under test is shorted to. This will be described in more detail in connection with FIGS. 12 and 13.

The schemes mentioned above in connection with FIGS. 8-10 are generally suitable for detecting short circuits between lines irrespective of types. The global tests such as W1, E1 are useful in rapidly checking if any of the word lines or erase lines are defective. However, they cannot test for word-line-to-word-line leakage or erase-line-to-erase-line leakage. The same is true of the global test B1 for bit lines. As far as the word lines and erase lines are concerned, this does not pose a problem as short circuits between word lines or between erase lines are unlikely. As for bit lines, short circuits between bit lines are possible and an alternative global test for bit lines is used in favor of the test B1 in FIG. 10.

FIG. 11, C1 list example test voltage conditions for one such embodiment. The bit lines of the memory array are powered as if for normal read operation (e.g., the selected column's source line=0 V, drain line=1.5 V, and unselected columns' bit lines are all floating.) However, unlike a normal read operation where a row is selected with its word line raised to 5 V (see FIG. 3), the selected column's $I_{DS}$ is now sensed with all the intersecting word lines at 0 volts. $I_{DS}$ should be vanishingly small, below a predetermined value as compared to a test mode sense amplifier reference current. If an abnormal current is detected, the source line and the drain line in the selected column must be shorted together. In the preferred embodiment, a two pass global scheme is employed to speed up the test. In the first pass, the bit lines in every other column are powered as if for read operation and tested simultaneously. In the second pass, the test is applied to the remaining columns.

Whenever a short circuit is detected in the global test, the columns should be re-tested column-by-column (as in FIG. 11, C2) to identify the defective column.

FIG. 11, C3 lists an example test voltage condition for another embodiment of testing an individual column (Dedicated "1" test.) In this case, one row and preferable a sector of memory cells in the array are not used to store data but are dedicated for the purpose of bit-line to bit-line leakage testing. The memory cells in the dedicated row or sector are always all programmed to the "programmed" or "1" state. This means that upon reading these cells, $I_{DS}$ should be vanishingly small. For example, when a column is selected to be tested, the dedicated "1" cells in the column are read similar to that of a normal read operation to verify if they are still "1" but with a predetermined current margin set by the test mode. If the dedicated cells are read to be "0" states instead (i.e. fail to verify), the drain and source line of the column under test may be interpreted as being short circuited.

Another type of column defect is due to a short circuit in a bit line select transistor. The defect manifests itself as a bit line stuck at HIGH (e.g., 5 V.) As described in connection with FIG. 5, a bit line transistor 241 is typically used to gain access to a bit line such as B0. The bit line is connected in series through the source 243 and drain 245 of its bit line select transistor 241. Conduction takes place between the source and drain when 5 V is supplied to the control gate of the bit line select transistor, and the bit line becomes accessible through the select transistor. However, when the select transistor becomes defective, its drain 245 and hence the bit line B0 connected thereto may be stuck at 5 V due to a short circuit between its control gate 247 and drain 245.

FIG. 11, C4 lists an example test voltage condition for testing this type of defect, a dedicated row or, preferably, a dedicated sector of memory cells are employed. All the cells in the dedicated row or sector are kept in the "erased" or "0" state. This means that during a normal read of these cells, $I_{DS}$ should be above a predetermined level, substantially above zero. If these cells are read to be in the "1" states, the sensed $I_{DS}$ is less than expected and some of the current must have been diverted through a short-circuited path.

Data recovery and defect mapping

The invention enables word lines, erase lines and bit lines to be tested and any defect therein to be detected and its type distinguished. The tests are advantageously performed both at the factory and in the field. During field use of the memory, the tests are preferably performed after memory operations that involve stressful high voltages, such as program and erase operations. Alternatively, the tests may be performed after a number of such memory operations to not significantly impact performance.

Once a defect is detected, and its location and type determined, any compromised data originally stored in the related defective cells must be recovered or corrected. The defective cells are then mapped out and replaced by good ones. Defect mapping schemes have been disclosed in co-pending U.S. patent application, Ser. No. 337,566 and co-pending U.S. patent application, Ser. No. 422,949, relevant portions thereof are expressly incorporated herein by reference.

When a word line defect is detected after a program operation, the row of cells sharing the defective word line is mapped out. Alternatively, the entire sector containing the defective word line is mapped out. The memory system usually has data intended for programming kept in a data buffer which is not overwritten until programming for an entire row or an entire sector has been completed and verified. If a word line test after programming detects a defect, data for the entire row or entire sector is recoverable. If the test is performed after an erase operation, no data needs to be recovered.

When an erase line defect is detected after an erase operation, no data needs to be recovered and the entire sector containing the erase line is mapped out to an alternative good location in the memory system.

When a leaky column (due to shorts between a bit line and a word line or an erase line or substrate) is detected, the present invention calls for a technique, switched-memory-source-drain (SMSD), to recover the data in cells along the defective column and any other columns that may also be affected. The cells in the defective and affected columns are read with voltage connections to the source and drain lines switched. For example, if normally $V_S=0$ V, $V_D=1.5$ V, they become $V_S=1.5$ V and $V_D=0$ V. In this way, a shorted drain line does not affect the zero voltage assigned to it or the zero voltage assigned to adjacent affected column. Once the data in the leaky column is read out, the entire column and one or more affected adjacent column are turned off by programming all the cells therein to the most "programmed" state (i.e. one with the least $I_{DS}$.) The leaky column can then be mapped out and not be used again. The turned-off adjacent columns are also mapped out and cells therein kept programmed to an non-conducting state to prevent any leakage from propagating to other columns.

When a bit-line-to-bit line leakage is detected after programming or erasing, the defective cell is turned off and either it is mapped out or the segment or the entire column is mapped out. Data is recoverable from either the data buffer or from an error correction code (ECC). The defective cell is located by the intersection of the selected column under test, and the row or sector just acted on during the programming or erasing operation. The located defective cell is turned off by programming it to the most "programmed" state as described before.

When a column defect is a bit line stuck HIGH, the entire column is mapped out. Data is recoverable by ECC. The defective bit line is electrically isolated by programming the columns on either side of it to the most "programmed" state.

Combination test

In order to isolate which type of lines are being shorted to, one embodiment is to establish a potential difference between the line under test and only one type of line while keeping the other types of line electrically floating.

FIG. 12 is a logic table illustrating diagnosis of defect type from combination of test results. For example, if a selected word line is under test, and there is a 12 volt difference between it and the set of erase lines while all the bit lines are floating, then any short circuit detected must be between the selected word line and one of the erase lines or the substrate. If on the other hand the set of erase lines is floating instead, then any short circuit must be between the selected word line and one of the bit lines or the substrate.

Figure 13:
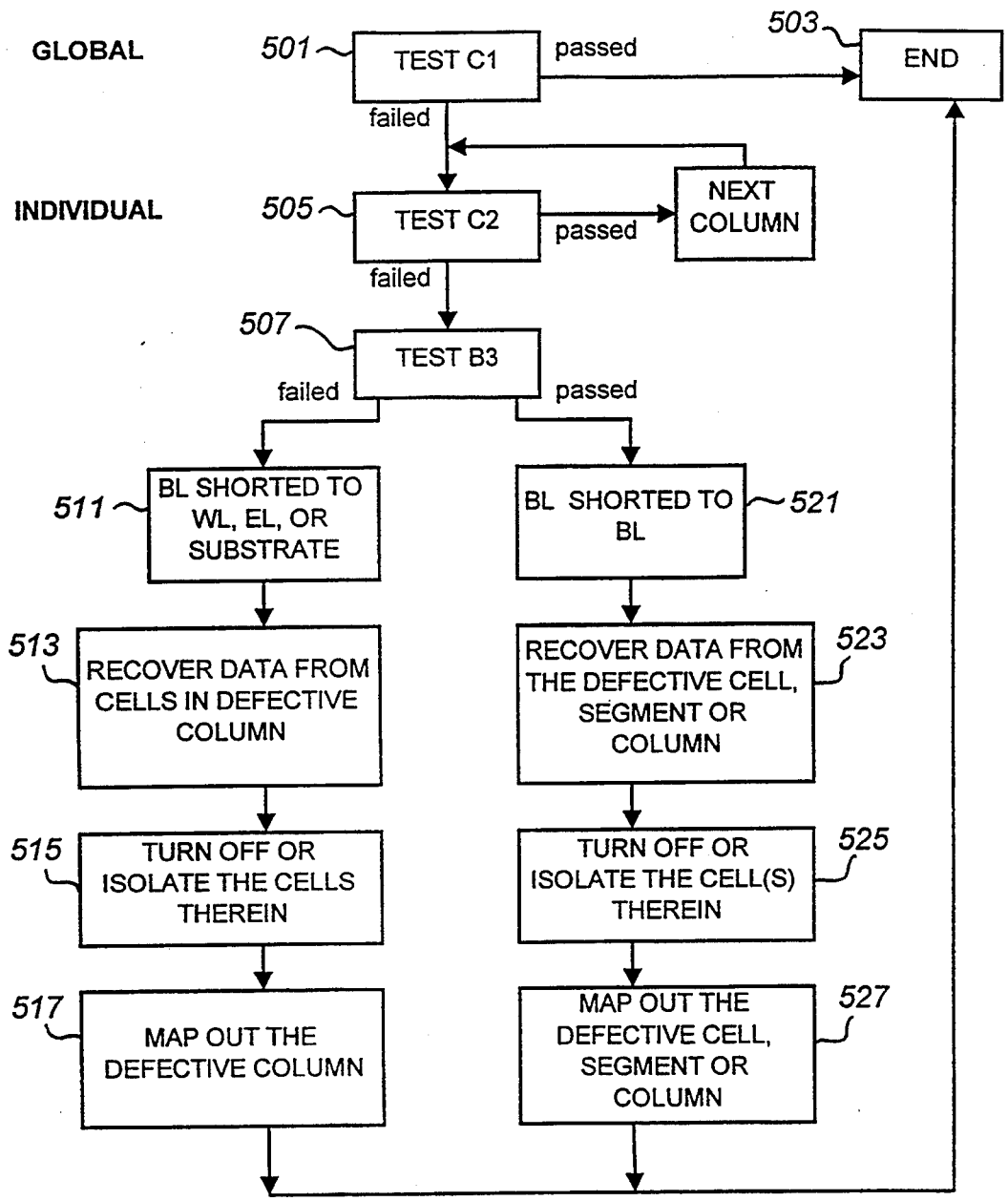
FIG. 13 is a flow chart illustrating defect detection and handling for bit lines.

FIG. 13 is a flow chart illustrating one embodiment of combining several test to detect and handle column defects. In step 501, the bit lines of the memory array is globally tested by the test C1 (see FIG. 11). If the test passes, no column defect is detected and the sequence ends in step 503. If the global test fails, the sequence enters into step 505 where the test C2 (see FIG. 11) identifies the individual defective column. In step 507, the test B3 is applied to the defective column.

In step 511, when the test B3 fails, the bit line (drain) in the defective column is shorted to either a word line, an erase line or the substrate. In step 513, the data in the defective column is recovered. In step 515, the cells in the defective column is either turned off by programming to the "most programmed" state if possible or isolated by turning off one or more adjacent columns to the source side of the defective column. In step 517, the defective column is mapped out and the recovered data is replaced in replacement columns. Thereafter, the sequence ends in step 503.

In step 521, when the test B3 passes, the bit line (drain) in the defective column is shorted to the other bit line (source)in the column.

As described above, the defect may be handled at three level of granularity, viz: the defective cell; the segment containing the defective cell; or the column containing the defective cell. The column is identified by the test C2. The segment is identified by the intersection of the column with the sector operated on just prior to detection of a defect. The defective cell may be identified by observing which cell in the segment fails to program properly.

In step 523, the data in the defective cell, segment or column is recovered. In step 525, the defective cell, segment or column is either turned off by programming to the "most programmed" state if possible or isolated by turning off one or more adjacent cells, segments or columns to the source side of the defective column. In step 527, the defective column is mapped out and the recovered data is replaced in replacement cells, segments or columns. Thereafter, the sequence ends in step 503.

While the embodiments of the various aspects of the present invention that have been described are the preferred implementation, those skilled in the art will understand that variations thereof may also be possible. Therefore, the invention is entitled to protection within the scope of the appended claims.

It is claimed:

1. In an integrated circuit memory device having an array of addressable semiconductor electrically erasable and programmable (EEPROM) memory cells, the memory cell being of the type including a substrate, a source, a drain, and a control gate electrode receptive to specific voltage conditions for memory operations such as reading, programming and erasing of data in the cell, and having a floating gate capable of retaining a specific charge level corresponding to a specific memory state of the cell, said array of memory cells being organized in a two-dimensional array addressable by access lines, wherein a word line thereamong is connected to the control gates of each row of memory cells, and a pair of bit lines thereamong are respectively connected to the sources and the drains of each column of memory cells, such that the two-dimensional array is addressable by rows and columns of access lines during memory operations by specific voltage conditions thereon, said integrated circuit memory device further comprising:

a word line leakage detector for measuring leakage current in a word line connectable thereto; and means for connecting said word line leakage detector to a word line under test to measure the leakage current therein, whereby a defective word line is identifiable by said leakage current exceeding a predetermined level.

2. An integrated circuit memory device as in claim 1, wherein the memory cell being of the type including an erase electrode, and said access lines include erase lines, wherein an erase line is connected to the erase electrodes of each sector of cells consisting of one or more rows of memory cells, said integrated circuit memory device further comprising:

a erase line leakage detector for measuring leakage current in an erase line connectable thereto; and means for connecting said erase line leakage detector to an erase line under test to measure the leakage current therein, whereby a defective erase line is identifiable by said leakage current exceeding a predetermined level.

3. In an integrated circuit memory device having an array of addressable semiconductor electrically erasable and programmable (EEPROM) memory cells, the memory cell being of the type including a substrate, a source, a drain, and a control gate electrode receptive to specific voltage conditions for memory operations such as reading, programming and erasing of data in the cell, and having a floating gate capable of retaining a specific charge level corresponding to a specific memory state of the cell, said array of memory cells being organized in a two-dimensional array addressable by access lines, wherein one type of access line being word lines connected to the control gates of each row of memory cells, and another type of access line being bit lines connected to the sources or drains of each column of memory cells, such that the two-dimensional array is addressable by rows and columns of access lines during memory operations by specific voltage conditions thereon, a method for detecting word line defects in the EEPROM memory array comprising the steps of:

providing a memory controller for controlling memory operations of said memory device;

providing a word line leakage detector within said memory device;

establishing under the control of said memory controller a predetermined potential difference for a word line under test relative to the substrate and a set of access lines that are capable of being shorted to said word line under test;

using said word line leakage detector under the control of said memory controller to detect a short circuit condition at said word line under test when a leakage current measured therein exceeded a predetermined level; and repeating the steps of establishing a predetermined potential difference and detecting a short circuit condition for every word line to be tested in the EEPROM memory array.

4. A method for detecting word line defects in an EEPROM memory array as in claim 3, wherein the method is applied to a set of word lines under test simultaneously.

5. A method for detecting defects among a set of word lines in an EEPROM memory array as in claim 4, wherein said set of word lines includes all the word lines in the EEPROM memory array.

6. A method for detecting word line defects in an EEPROM memory array as in claim 3, wherein said method is implemented during use of the EEPROM memory array at preselected times.

7. A method for detecting word line defects in an EEPROM memory array as in claim 6, wherein the method is applied to a set of word lines under test simultaneously.

8. A method for detecting defects among a set of word lines in an EEPROM memory array as in claim 7, wherein said set of word lines consists of all the word lines in the EEPROM memory array.

9. A method for detecting word line defects in the EEPROM memory array as in claim 3, wherein:
the memory cell is of the type including an erase electrode;
the memory array is organized into sectors of cells consisting of one or more rows of cells that are erasable together; and
the access lines include erase lines connected to the erase electrodes of each sector of cells.

10. A method for detecting word line defects in the EEPROM memory array as in claim 9, wherein the step of raising the word line under test to a predetermined potential includes grounding a set of access lines that are capable of being shorted to said word line under test, so as to determine if the word line under test is shorted to the substrate or any one of said set of access lines.

11. A method for detecting word line defects in the EEPROM memory array as in claim 9, wherein the step of raising the word line under test to a predetermined potential includes, among said set of access lines, grounding the word lines therein while floating the erase lines and bit lines therein, so as to determine if the word line under test is shorted to the substrate or any one of the word lines therein.

12. A method for detecting word line defects in the EEPROM memory array as in claim 9, wherein the step of raising the word line under test to a predetermined potential includes, among said set of access lines, grounding the bit lines therein while floating the word lines and erase lines therein, so as to determine if the word line under test is shorted to the substrate or any one of the bit lines therein.

13. A method for detecting word line defects in the EEPROM memory array as in claim 9, wherein the step of raising the word line under test to a predetermined potential includes, among said set of access lines, grounding the erase lines therein while floating the word lines and bit lines therein, so as to determine if the word line under test is shorted to the substrate or any one of the erase lines therein.

14. A method for detecting word line defects in an EEPROM memory array as in claim 9, further including a sequence of tests such that in each test the step of raising the word line under test to a predetermined potential includes, among said set of access lines, a different combination of grounding or floating of each type of lines such as word lines or bit lines therein, so as to identify what type of line the word line under test is shorted to.

15. A method for detecting word line defects in an EEPROM memory array as in claim 3, further including a sequence of tests such that in each test the step of raising the word line under test to a predetermined potential includes, among said set of access lines, a different combination of grounding or floating of each type of lines such as word lines or bit lines therein, so as to identify what type of line the word line under test is shorted to.

16. In an integrated circuit memory device having an array of addressable semiconductor electrically erasable and programmable (EEPROM) memory cells, the memory cell being of the type including a substrate, a source, a drain, and a control gate electrode receptive to specific voltage conditions for memory operations such as reading, programming and erasing of data in the cell, and having a floating gate capable of retaining a specific charge level corresponding to a specific memory state of the cell, said array of memory cells being organized in a two-dimensional array addressable by access lines, wherein one type of access line being word lines connected to the control gates of each row of memory cells, and another type of access line being bit lines connected to the sources or drains of each column of memory cells, such that the two-dimensional array is addressable by rows and columns of access lines during memory operations by specific voltage conditions thereon, a method for detecting word line defects in the EEPROM memory array comprising the steps of:
providing a memory controller for controlling memory operations of said memory device;
establishing under the control of said memory controller a predetermined potential difference for a bit line under test relative to the substrate and a set of access lines that are capable of being shorted to said bit line under test;
detecting under the control of said memory controller a short circuit condition at said bit line under test when a leakage current measured therein exceeded a predetermined level; and
repeating the steps of establishing a predetermined potential difference and detecting a short circuit condition for every bit line to be tested in the EEPROM memory array.

17. A method for detecting bit line defects in an EEPROM memory array as in claim 16, wherein the method is applied to a set of bit lines under test simultaneously.

18. A method for detecting defects among a set of bit lines in an EEPROM memory array as in claim 16, wherein said set of bit lines includes all the bit lines in the EEPROM memory array.

19. A method for detecting bit line defects in an EEPROM memory array as in claim 16, wherein said method is implemented during use of the EEPROM memory array at preselected times.

20. A method for detecting bit line defects in an EEPROM memory array as in claim 19, wherein the method is applied to a set of bit lines under test simultaneously.

21. A method for detecting defects among a set of bit lines in an EEPROM memory array as in claim 20, wherein said set of bit lines consists of all the bit lines in the EEPROM memory array.

22. A method for detecting bit line defects in the EEPROM memory array as in claim 16, wherein:
   the memory cell is of the type including an erase electrode;
   the memory array is organized into sectors of cells consisting of one or more rows of cells that are erasable together; and
   the access lines include erase lines connected to the erase electrodes of each sector of cells.

23. A method for detecting bit line defects in the EEPROM memory array as in claim 22, wherein the step of raising the bit line under test to a predetermined potential includes grounding a set of access lines that are capable of being shorted to said bit line under test, so as to determine if the bit line under test is shorted to the substrate or any one of said set of access lines.

24. A method for detecting bit line defects in the EEPROM memory array as in claim 22, wherein the step of raising the bit line under test to a predetermined potential includes, among said set of access lines, grounding the bit lines therein while floating the erase lines and word lines therein, so as to determine if the bit line under test is shorted to the substrate or any one of the bit lines therein.

25. A method for detecting bit line defects in the EEPROM memory array as in claim 22, wherein the step of raising the bit line under test to a predetermined potential includes, among said set of access lines, grounding the word lines therein while floating the bit lines and erase lines therein, so as to determine if the bit line under test is shorted to the substrate or any one of the word lines therein.

26. A method for detecting bit line defects in the EEPROM memory array as in claim 22, wherein the step of raising the bit line under test to a predetermined potential includes, among said set of access lines, grounding the erase lines therein while floating the bit lines and word lines therein, so as to determine if the bit line under test is shorted to the substrate or any one of the erase lines therein.

27. A method for detecting bit line defects in an EEPROM memory array as in claim 22, further including a sequence of tests such that in each test the step of raising the bit line under test to a predetermined potential includes, among said set of access lines, a different combination of grounding or floating of each type of lines such as bit lines or word lines therein, so as to identify what type of line the bit line under test is shorted to.

28. A method for detecting bit line defects in an EEPROM memory array as in claim 16, further including a sequence of tests such that in each test the step of raising the bit line under test to a predetermined potential includes, among said set of access lines, a different combination of grounding or floating of each type of lines such as bit lines or word lines therein, so as to identify what type of line the bit line under test is shorted to.

29. In an integrated circuit memory device having an array of addressable semiconductor electrically erasable and programmable (EEPROM) memory cells, the memory cell being of the type including a substrate, a source, a drain, a control gate and an erase electrode receptive to specific voltage conditions for memory operations such as reading, programming and erasing of data in the cell, and having a floating gate capable of retaining a specific charge level corresponding to a specific memory state of the cell, said memory array being organized in a two-dimensional array and into sectors consisting of one or more rows of cells that are erasable together, the two-dimensional array being addressable by access lines, wherein one type of access line being word lines connected to the control gates of each row of memory cells, another type of access line being erase lines connected to the erase electrodes of every cells in each sector, and another type of access line being bit lines connected to the sources or drains of each column of memory cells, such that the two-dimensional array is addressable by rows and columns of access lines during memory operations by specific voltage conditions thereon, a method for detecting erase line defects in the EEPROM memory array comprising the steps of:
   providing a memory controller for controlling memory operations of said memory device;
   providing a erase line leakage line detector within said memory device;
   establishing under the control of said memory controller a predetermined potential difference for a erase line under test relative to the substrate and a set of access lines that are capable of being shorted to said erase line under test;
   using said erase line leakage detector under the control of said memory controller to detect a short circuit condition at said erase line under test when a leakage current measured therein exceeded a predetermined level; and
   repeating the steps of establishing a predetermined potential difference and detecting a short circuit condition for every erase line to be tested in the EEPROM memory array.

30. A method for detecting erase line defects in an EEPROM memory array as in claim 29, wherein the method is applied to a set of erase lines under test simultaneously.

31. A method for detecting defects among a set of erase lines in an EEPROM memory array as in claim 30, wherein said set of erase lines includes all the erase lines in the EEPROM memory array.

32. A method for detecting erase line defects in an EEPROM memory array as in claim 29, wherein said method is implemented during use of the EEPROM memory array at preselected times.

33. A method for detecting erase line defects in an EEPROM memory array as in claim 32, wherein the method is applied to a set of erase lines under test simultaneously.

34. A method for detecting defects among a set of erase lines in an EEPROM memory array as in claim 33, wherein said set of erase lines consists of all the erase lines in the EEPROM memory array.

35. A method for detecting erase line defects in the EEPROM memory array as in claim 29, wherein the step of raising the erase line under test to a predetermined potential includes grounding a set of access lines that are capable of being shorted to said erase line under test, so as to determine if the erase line under test is shorted to the substrate or any one of said set of access lines.

36. A method for detecting erase line defects in the EEPROM memory array as in claim 29, wherein the step of raising the erase line under test to a predetermined potential includes, among said set of access lines, grounding the erase lines therein while floating the word lines and bit lines therein, so as to determine if the erase line under test is shorted to the substrate or any one of the erase lines therein.

37. A method for detecting erase line defects in the EEPROM memory array as in claim 29, wherein the step of raising the erase line under test to a predetermined potential includes, among said set of access lines, grounding the bit lines therein while floating the erase lines and word lines therein, so as to determine if the erase line under test is shorted to the substrate or any one of the bit lines therein.

38. A method for detecting erase line defects in the EEPROM memory array as in claim 29, wherein the step of raising the erase line under test to a predetermined potential includes, among said set of access lines, grounding the word lines therein while floating the erase lines and bit lines therein, so as to determine if the erase line under test is shorted to the substrate or any one of the erase lines therein.

39. A method for detecting erase line defects in an EEPROM memory array as in claim 29, further including a sequence of tests such that in each test the step of raising the erase line under test to a predetermined potential includes, among said set of access lines, a different combination of grounding or floating of each type of lines such as erase lines or bit lines therein, so as to identify what type of line the erase line under test is shorted to.

40. In an integrated circuit memory device having an array of addressable semiconductor electrically erasable and programmable (EEPROM) memory cells, the memory cell being of the type including a substrate, a source, a drain, a control gate and an erase electrode receptive to specific voltage conditions for memory operations such as reading, programming and erasing of data in the cell, and having a floating gate capable of retaining a specific charge level corresponding to a specific memory state of the cell, said memory array being organized in a two-dimensional array and into sectors consisting of one or more rows of cells that are erasable together, the two-dimensional array being addressable by access lines, wherein one type of access line being word lines connected to the control gates of each row of memory cells, another type of access line being erase lines connected to the erase electrodes of every cells in each sector, and another type of access line being bit lines connected to the sources or drains of each column of memory cells, such that the two-dimensional array is addressable by rows and columns of access lines during memory operations by specific voltage conditions thereon, a method for detecting defects in a specified type of access line in the EEPROM memory array comprising the steps of:

providing a memory controller for controlling memory operations of said memory device;

providing a leakage detector within said memory device establishing under the control of said memory controller a predetermined potential difference for an access line under test of said specified type relative to the substrate and a set of access lines that are capable of being shorted to said access line under test;

using said leakage detector under the control of said memory controller to detect a short circuit condition at said access line under test when a leakage current measured therein exceeded a predetermined level; and repeating the steps of establishing a predetermined potential difference and detecting a short circuit condition for every access line of said specified type to be tested in the EEPROM memory array.

41. A method for detecting defects in a specified type of access line in the EEPROM memory array as in claim 40, wherein the method is applied to a set of access lines of said specified type under test simultaneously.

42. A method for detecting defects in a set of specified type of access line in an EEPROM memory array as in claim 41, wherein said set includes all access lines of said specified type in the EEPROM memory array.

43. A method for detecting defects in a specified type of access line in an EEPROM memory array as in claim 40, wherein said method is implemented during use of the EEPROM memory array at preselected times.

44. A method for detecting defects in a specified type of access line in the EEPROM memory array as in claim 43, wherein the method is applied to a set of access lines of said specified type under test simultaneously.

45. A method for detecting defects in a set of specified type of access line in an EEPROM memory array as in claim 44, wherein said set includes all access lines of said specified type in the EEPROM memory array.

46. In an integrated circuit memory device having an array of addressable semiconductor electrically erasable and programmable (EEPROM) memory cells, the memory cell being of the type including a substrate, a source, a drain, a control gate and an erase electrode receptive to specific voltage conditions for memory operations such as reading, programming and erasing of data in the cell, and having a floating gate capable of retaining a specific charge level corresponding to a specific memory state of the cell, said memory array being organized in a two-dimensional array and into sectors consisting of one or more rows of cells that are erasable together, the two-dimensional array being addressable by access lines, wherein one type of access line being word lines connected to the control gates of each row of memory cells, another type of access line being erase lines connected to the erase electrodes of every cells in each sector, and another type of access line being bit lines connected to the sources or drains of each column of memory cells, such that the two-dimensional array is addressable by rows and columns of access lines during memory operations by specific voltage conditions thereon, a method for detecting column defects due to a bit line shorted to another type of access line in the EEPROM memory array, comprising the steps of:

providing a memory controller for controlling memory operations of said memory device;

powering under the control of said memory controller a pair of bit lines in a column under test to voltage conditions for reading while keeping all other bit lines in the EEPROM memory array floated and all word lines and erase lines grounded;

detecting under the control of said memory controller a short circuit condition at said pair of bit lines under test when a leakage current measured therein exceeded a predetermined level; and repeating the steps of powering and detecting for the pair of bit lines in every column to be tested in the EEPROM memory array.

47. A method for detecting column defects due to a bit line shorted to another type of access line in the EEPROM memory array as in claim 46, wherein said method is implemented during use of the EEPROM memory array at preselected times.

48. In an integrated circuit memory device having an array of addressable semiconductor electrically erasable and programmable (EEPROM) memory cells, the memory cell being of the type including a substrate, a source, a drain, a control gate and an erase electrode receptive to specific voltage conditions for memory operations such as reading, programming and erasing of data in the cell, and having a floating gate capable of retaining a specific charge level corresponding to a specific memory state of the cell, said memory array being organized in a two-dimensional array and into sectors consisting of one or more rows of cells that are erasable together, the two-dimensional array being addressable by access lines, wherein one type of access line being word lines connected to the control gates of each row of memory cells, another type of access line being erase lines connected to the erase electrodes of every cells in each sector, and another type of access line being bit lines connected to the sources or drains of each column of memory cells, such that the two-dimensional array is addressable by rows and columns of access lines during memory operations by specific voltage conditions thereon, a method for detecting column defects due to bit line short circuit in the EEPROM memory array, comprising the steps of:

providing a memory controller for controlling memory operations of said memory device;

powering under the control of said memory controller a pair of bit lines in each column among a set of columns simultaneously under test to voltage conditions for reading while keeping all word lines grounded and all other bit lines floated;

detecting under the control of said memory controller a short circuit condition at the pair of bit lines in each column among the set of columns simultaneously under test when a leakage current measured in the pair of bit lines exceeded a predetermined level; and repeating the steps of powering and detecting for every set of columns simultaneously under test in the EEPROM memory array.

49. A method for detecting column defects in an EEPROM memory array as in claim 48, wherein the set of columns simultaneously under test consists of one column in the EEPROM memory array.

50. A method for detecting column defects in an EEPROM memory array as in claim 48, wherein the set of columns simultaneously under test consists of alternate columns in the EEPROM memory array.

51. A method for detecting column defects due to bit line short circuit in the EEPROM memory array as in claim 48, wherein said method is implemented during use of the EEPROM memory array at preselected times.

52. In an integrated circuit memory device having an array of addressable semiconductor electrically erasable and programmable (EEPROM) memory cells, the memory cell being of the type including a substrate, a source, a drain, a control gate and an erase electrode receptive to specific voltage conditions for memory operations such as reading, programming and erasing of data in the cell, and having a floating gate capable of retaining a specific charge level corresponding to a specific memory state of the cell, said memory array being organized in a two-dimensional array and into sectors consisting of one or more rows of cells that are erasable together, the two-dimensional array being addressable by access lines, wherein one type of access line being word lines connected to the control gates of each row of memory cells, another type of access line being erase lines connected to the erase electrodes of every cells in each sector, and another type of access line being bit lines connected to the sources or drains of each column of memory cells, such that the two-dimensional array is addressable by rows and columns of access lines during memory operations by specific voltage conditions thereon, a method for detecting column defects due to bit line short circuit in the EEPROM memory array, comprising the steps of:

providing a memory controller for controlling memory operations of said memory device;

maintaining at least one row of cells all pre-programmed to a memory state corresponding substantially to a minimum conduction current through the source and drain of each cell during a read operation;

detecting under the control of said memory controller any short circuit condition at a column by reading the programmed memory state in each of said at least one row of cells therein and determining if the pair of bit lines in the column has a conduction current substantially more than said minimum current; and repeating the steps of reading and detecting for every column to be tested in the EEPROM memory array.

53. A method for detecting column defects due to bit line short circuit in the EEPROM memory array as in claim 52, wherein said method is applied to a set of columns at a time.

54. A method for detecting column defects due to bit line short circuit in the EEPROM memory array as in claim 52, wherein said method is implemented during use of the EEPROM memory array at preselected times.

55. In an integrated circuit memory device having an array of addressable semiconductor electrically erasable and programmable (EEPROM) memory cells, the memory cell being of the type including a substrate, a source, a drain, a control gate and an erase electrode receptive to specific voltage conditions for memory operations such as reading, programming and erasing of data in the cell, and having a floating gate capable of retaining a specific charge level corresponding to a specific memory state of the cell, said memory array being organized in a two-dimensional array and into sectors consisting of one or more rows of cells that are erasable together, the two-dimensional array being addressable by access lines, wherein one type of access line being word lines connected to the control gates of each row of memory cells, another type of access line being erase lines connected to the erase electrodes of every cells in each sector, and another type of access line being bit lines connected to the sources or drains of each column of memory cells, such that the two-dimensional array is addressable by rows and columns of access lines during memory operations by specific voltage conditions thereon, a method for detecting column defects due to bit line short circuit in the EEPROM memory array, comprising the steps of:

provilding a memory controller for controlling memory operations of said nenory device;

maintaining at least one row of cells all pre-erased to a memory state corresponding to substantially a maximum conduction current through the source and drain of each cell during a read operation;

detecting under the control of said memory controller any short circuit condition at a column by reading the programmed memory state in each of said at least one row of cells therein and determining if the pair of bit lines in the column has a conduction current substantially less than said maximum conduction current; and repeating the steps of reading and detecting for every column to be tested in the EEPROM memory array.

56. A method for detecting column defects due to bit line short circuit in the EEPROM memory array as in claim 55, wherein said method is applied to a set of columns at a time.

57. A method for detecting column defects due to bit line short circuit in the EEPROM memory array as in claim 55, wherein said method is implemented during use of the EEPROM memory array at preselected times.

58. In an integrated circuit memory device having an array of addressable semiconductor electrically erasable and programmable (EEPROM) memory cells, the memory cell being of the type including a substrate, a source, a drain, a control gate and an erase electrode receptive to specific voltage conditions for memory operations such as reading, programming and erasing of data in the cell, and having a floating gate capable of retaining a specific charge level corresponding to a specific memory state of the cell, said memory array being organized in a two-dimensional array and into sectors consisting of one or more rows of cells that are erasable together, the two-dimensional array being addressable by access lines, wherein one type of access line being word lines connected to the control gates of each row of memory cells, another type of access line being erase lines connected to the erase electrodes of every cells in each sector, and another type of access line being bit lines connected to the sources or drains of each column of memory cells, such that the two-dimensional array is addressable by rows and columns of access lines during memory operations by specific voltage conditions thereon, a method for handling defects in the EEPROM memory array comprising providing a memory controller for controlling memory operations of said memory device, said memory controller performing the steps of:

detecting any defective access line of the memory array by measuring therein a leakage current that exceeds a predetermined level;

recovering the data from defective memory cells in said defective access line;

mapping out the defective memory cells in said defective access line and replacing with substitute memory cells;

replacing the recovered data in the substitute memory cells.

59. A method for handling defects in the EEPROM memory array as in claim 58, wherein said method is implemented during use of the EEPROM memory array at preselected times.

60. A method for handling defects in the EEPROM memory array as in claim 58, wherein said defective access line is a bit line and results in a defective column containing said defective bit line.

61. A method for handling defects in the EEPROM memory array as in claim 60, further comprising:

electrically isolating the defective memory cells in said defective bit line by programming each of said defective memory cells whose drain is connected by the defective bit line to a memory state corresponding to a minimum source to drain conduction current.

62. A method for handling defects in the EEPROM memory array as in claim 60, further comprising:

electrically isolating the defective memory cells in said defective bit line by programming one or more cells in adjacent columns to each of said defective memory cells a memory state corresponding to a minimum source to drain conduction current.

63. A method for handling defects in the EEPROM memory array as in claim 60, wherein the step of recovering the data from memory cells in a defective column resulting from a short circuit of a drain line thereof to a word line or an erase line or substrate includes reading the data from memory cells in said defective column by interchanging the potential applied to the source line and the drain line therein.

64. A method for handling defects in the EEPROM memory array as in claim 62, further comprising:

determining whether the defective bit line is shorted to another bit line or to a word line or an erase line or substrate, wherein the steps of recovering the data, mapping out, replacing the recovered data and electrically isolating apply to:

all cells in the defective column when the defective bit line is shorted to a word line, erase line or substrate; and at least the defective cells in the defective column when the defective bit line is shorted to another bit line.

* * * * *

UNITED STATES PATENT AND TRADEMARK OFFICE
CERTIFICATE OF CORRECTION

PATENT NO. : 5,428,621
DATED : June 27, 1995
INVENTOR(S) : Mehrotra et al.

It is certified that error appears in the above-indentified patent and that said Letters Patent is hereby corrected as shown below:

In Column 18, Line 28 in Claim 29
    replace  "providing a erase line leakage line detector within" with:

--providing a erase line leakage detector within--

In Column 23, Line 8 in Claim 55
    replace  "ory operations of said nenory device; " with --ory operations of said memory device;--

Signed and Sealed this

Twenty-seventh Day of August, 1996

Attest:

BRUCE LEHMAN

*Attesting Officer*    *Commissioner of Patents and Trademarks*